United States Patent
Lin

(10) Patent No.: US 10,784,300 B1
(45) Date of Patent: Sep. 22, 2020

(54) SOLID-STATE IMAGING DEVICES

(71) Applicant: VisEra Technologies Company Limited, Hsin-Chu (TW)

(72) Inventor: Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/385,463

(22) Filed: Apr. 16, 2019

(51) Int. Cl.
  *H01L 27/146* (2006.01)

(52) U.S. Cl.
  CPC .... *H01L 27/14623* (2013.01); *H01L 27/1462* (2013.01); *H01L 27/1463* (2013.01); *H01L 27/14621* (2013.01); *H01L 27/14645* (2013.01)

(58) Field of Classification Search
  CPC ........... H01L 27/1463; H01L 27/14645; H01L 27/14623; H01L 27/14621; H01L 27/14601; H01L 27/14605
  See application file for complete search history.

(56) References Cited

U.S. PATENT DOCUMENTS

| | | | |
|---|---|---|---|
| 2014/0211057 A1* | 7/2014 | Chien | H01L 27/14609 348/308 |
| 2015/0372030 A1* | 12/2015 | Cheng | H01L 27/1462 257/432 |
| 2016/0172412 A1* | 6/2016 | Lee | H01L 27/14605 257/432 |
| 2017/0265822 A1* | 9/2017 | Du | A61B 6/03 |

* cited by examiner

*Primary Examiner* — Hsien Ming Lee
(74) *Attorney, Agent, or Firm* — Muncy, Geissler, Olds & Lowe, P.C.

(57) ABSTRACT

The solid-state imaging device includes a first set of units disposed in a substrate and including a first pixel unit, a second pixel unit and a third pixel unit. The first pixel unit, the second pixel unit and the third pixel unit are sequentially arranged and include respective photoelectric conversion elements. The solid-state imaging device also includes a metal grid structure disposed over the first set of units and including a first portion and a second portion. The first portion is disposed between the first pixel unit and the second pixel unit and has a first width. The second portion is disposed between the second pixel unit and the third pixel unit and has a second width that is greater than the first width.

18 Claims, 11 Drawing Sheets

US 10,784,300 B1

SOLID-STATE IMAGING DEVICES

BACKGROUND

Field of the Invention

The invention relates to solid-state imaging devices, and more particularly, to solid-state imaging devices without a microlens.

Description of the Related Art

An image sensor is a kind of semiconductor device that transforms photons into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

Recently, phase detection autofocus (PDAF) technology has been introduced into Digital Single Lens Reflex Cameras (DSLR), Digital Still Cameras (DSC) and Smartphone Cameras. The principle is to have a pair of half opaque green pixels with a whole microlens thereabove. The differential signals of the two green pixels aid in the phase detection autofocus function. However, the color purity of incident light falling on the photoelectric conversion elements of the pixels is difficult to enhance because forming microlenses on the pixels limits the thickness of the color filter of the pixels.

Therefore, development of a novel image-sensor structure without the need for a microlens is desirable.

BRIEF SUMMARY

In solid-state imaging devices, an incident light radiates onto the non-central area of a pixel array at an oblique angle that is greater than the normal angle of the incident light radiating onto the central area of the pixel array. The incident angle is an angle between the normal line of a light-receiving surface of the solid-state imaging device and the incident light. Thus, crosstalk between the pixel units in the non-central area is higher than in the central area which reduces the sensitivity of the PDAF pixel units in the non-central area.

According to embodiments of the disclosure, a metal grid structure of solid-state imaging devices includes a metal grid disposed at a side of a PDAF pixel unit which is close to the pixel array center. The metal grid has a width that is greater than the width of a metal grid disposed between two image-capture pixel units, which reduces the crosstalk between pixel units and increases the sensitivity of the PDAF pixel units.

Some embodiments of the present disclosure provide a solid-state imaging device. The solid-state imaging device includes a first set of units disposed in a substrate and including a first pixel unit, a second pixel unit and a third pixel unit. The first pixel unit, the second pixel unit and the third pixel unit are sequentially arranged and include respective photoelectric conversion elements. The solid-state imaging device also includes a metal grid structure disposed over the first set of units. The metal grid structure includes a first portion and a second portion. The first portion is disposed between the first pixel unit and the second pixel unit and has a first width. The second portion is disposed between the second pixel unit and the third pixel unit and has a second width that is greater than the first width.

A detailed description is given in the following embodiments with reference to the accompanying drawings.

BRIEF DESCRIPTION OF DRAWINGS

The embodiments of the disclosure can be more fully understood by reading the subsequent detailed description and examples with references made to the accompanying drawings. For clarity of illustration, various elements in the drawings may not be drawn to scale, wherein:

FIGS. 1C-1, 1C-2 and 1C-3 show cross-sectional views of portions of the solid-state imaging device shown in FIG. 1A in accordance with some other embodiments of the present disclosure;

FIG. 3 is a graph of angular response curves (ARCs) illustrating simulated results of the relationship between the sensitivity of a PDAF pixel unit in a central area of a pixel array and an incidence angle of an incident light on a PDAF pixel unit in accordance with some embodiments of the present disclosure.

DETAILED DESCRIPTION OF INVENTION

Figure 1A:
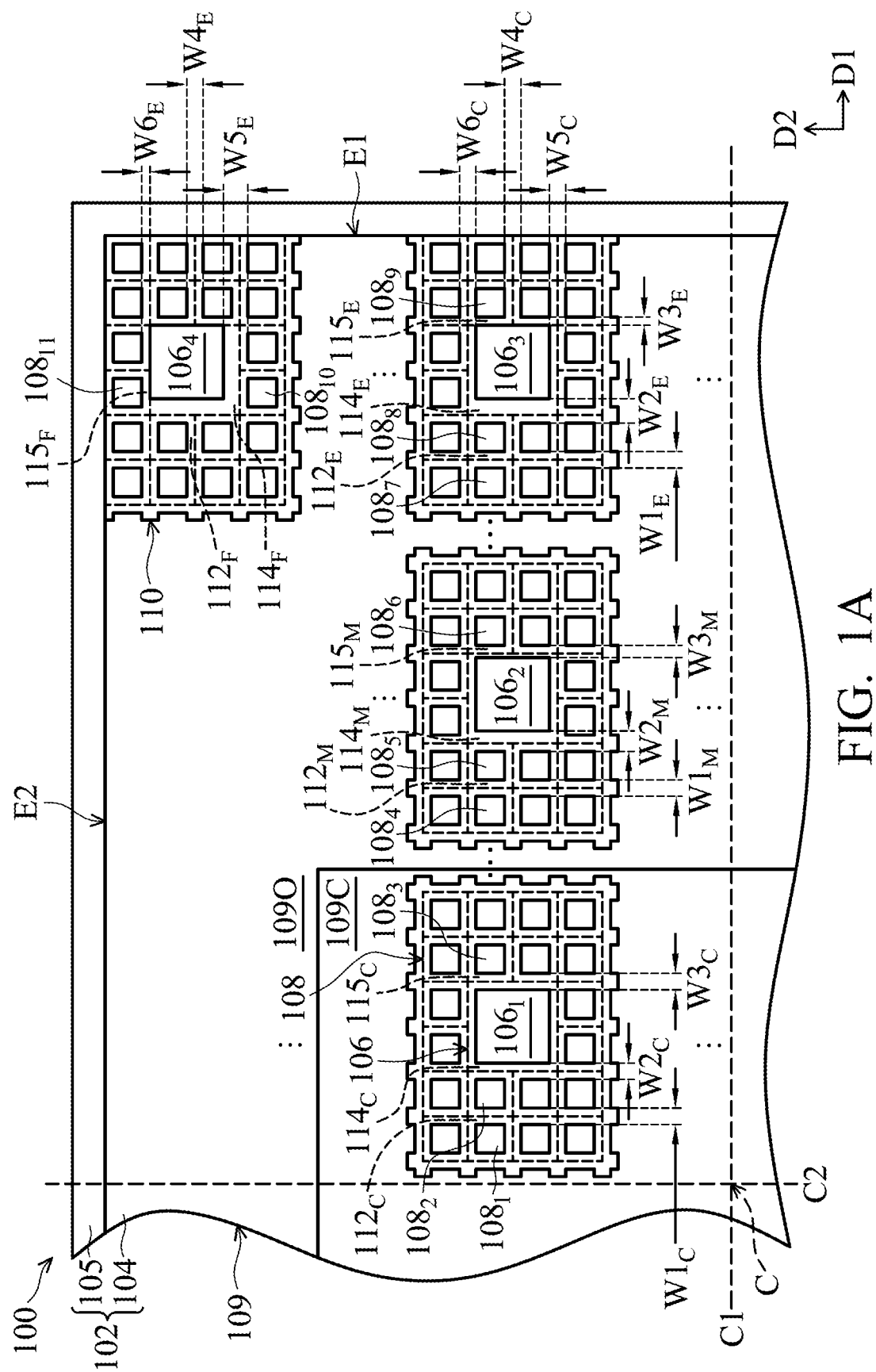
FIG. 1A shows a top view of a solid-state imaging device in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Referring to FIG. 1A, which shows a top view of a solid-state imaging device 100 in accordance with some embodiments of the present disclosure. The solid-state imaging device 100 includes a substrate 102, a pixel array 109 disposed in the substrate 102, and a metal grid structure 110 disposed over the pixel array 109.

The substrate 102 includes an array region 104 and a light-shielding region 105 around the array region 104. The pixel array 109 is located in the array region 104. The pixel array 109 includes phase detection autofocus (PDAF) pixel units 106 and image-capture pixel units 108 (illustrated by dash squares) arrayed in a first direction D1 and a second direction D2 that is perpendicular to the first direction D1.

The first direction D1 is parallel to a length direction of the rectangular shape of the pixel array 109 while the second direction D2 is parallel to a width direction of the rectangular shape of the pixel array 109. The first direction D1 is a direction which extends from a center C toward an edge E1 of the pixel array 109 while the second direction D2 is a direction which extends from the center C toward an edge E2 of the pixel array 109.

The pixel array 109 has a first central line C1 parallel to the first direction D1 and a second central line C2 parallel to the second direction D2. The first central line C1 intersects the second central line C2 at the center C of the pixel array 109. The pixel array 109 includes a central area 109C and a non-central area 109O around the central area 109C, and the center C of the pixel array 109 is located in the central area 109C. In some embodiments, the central area 109C may have a rectangular shape or a round shape. In some embodiments, the central area 109C may include an area that extends 15% of the length (or width) of the pixel array 109 from the center C toward the edges of the pixel array 109.

The PDAF pixel units 106 and the image-capture pixel units 108 include respective photoelectric conversion elements (not shown in FIG. 1A) which are formed in the substrate 102. PDAF is used to quickly focus on an object by determining distance to the object from a phase difference of radiation incident on pairs of PDAF pixels units 106.

The metal grid structure 110 is formed over the substrate 102. The metal grid structure 110 includes horizontal portions extending along the first direction D1 and vertical portions extending along the second direction D2. These portions of metal grid structure 110 are correspondingly disposed at the boundaries between the pixel units. In specific, a portion of the metal grid structure 110 disposed at a boundary between two neighboring image-capture pixel units 108 is defined as a first portion 112. Portions of the metal grid structure 110 disposed at boundaries between a PDAF pixel unit 106 and two image-capture pixel units 108 adjacent thereto are defined as a second portion 114 and a third portion 115. The second portion 114 is disposed at a side of a PDAF pixel unit 106 which is close to the pixel array center C, and the third portion 115 is disposed at the other side of the PDAF pixel unit 106 close to the pixel array edge E1 (or E2).

For example, a set of units is disposed in the central area 109C of the pixel array 109. The set of units includes an image-capture pixel unit $108_1$, an image-capture pixel unit $108_2$, a PDAF pixel unit 106, and an image-capture pixel unit $108_3$ which are sequentially arranged in the first direction D1. The portion $112_C$ is disposed between the image-capture pixel unit $108_1$ and the image-capture pixel unit $108_2$. The portion $114_C$ is disposed between the image-capture pixel unit $108_2$ and the PDAF pixel unit $106_2$. The portion $115_C$ is disposed between the PDAF pixel unit $106_1$ and the image-capture pixel unit $108_3$.

For example, a set of units is disposed in an intermediate area of the pixel array 109. The set of units includes an image-capture pixel unit $108_4$, an image-capture pixel unit $108_5$, a PDAF pixel unit $106_2$ and an image-capture pixel unit $108_6$ which are sequentially arranged in the first direction D1. The portion $112_M$ is disposed between the image-capture pixel unit $108_4$ and the image-capture pixel unit $108_5$. The portion $114_M$ is disposed between the image-capture pixel unit $108_5$ and the PDAF pixel unit $106_2$. The portion $115_M$ is disposed between the PDAF pixel unit $106_2$ and the image-capture pixel unit $108_6$.

For example, a set of units is disposed in an edge area of the pixel array 109. The set of units includes an image-capture pixel unit $108_7$, an image-capture pixel unit $108_8$, a PDAF pixel unit $106_3$ and an image-capture pixel unit $108_9$ which are sequentially arranged in the first direction D1. The portion $112_E$ is disposed between the image-capture pixel unit $108_7$ and the image-capture pixel unit $108_8$. The portion $114_E$ is disposed between the image-capture pixel unit $108s$ and the PDAF pixel unit $106_3$. The portion $115_E$ is disposed between the PDAF pixel unit $106_3$ and the image-capture pixel unit $108_9$.

For example, a set of units is disposed in a corner area of the pixel array 109. The set of units includes an image-capture pixel unit $108_{10}$, a PDAF pixel unit $106_4$ and an image-capture pixel unit $108_{11}$ which are sequentially arranged in the second direction D2. The portion $114_F$ is disposed between the image-capture pixel unit $108_{10}$ and the PDAF pixel unit $106_4$. The portion $115_F$ is disposed between the PDAF pixel unit $106_4$ and the image-capture pixel unit $108_{11}$.

For the sake of simplicity and clarity, FIG. 1A only shows the above features, and remaining features are shown in cross-sectional views of FIGS. 1B-1, 1B-2 and 1B-3.

Referring to FIGS. 1B-1, 1B-2 and 1B-3, FIGS. 1B-1, 1B-2 and 1B-3 are cross-sectional views illustrating portions of the solid-state imaging device 100 in the central area, the intermediate area and the edge area respectively. In an embodiment, the substrate 102 may be a silicon substrate. In some embodiments, the semiconductor substrate 102 may be a silicon germanium substrate, a gallium arsenide substrate, or the like. In some embodiments, the substrate 102 may be a germanium substrate, a semiconductor-on-insulator substrate, such as a silicon-on-insulator (SOI) substrate.

The solid-state imaging device 100 also includes an isolation structure 120 disposed in the substrate 102. The isolation structure 120 defines the PDAF pixel units 106 and image-capture pixel units 108 of the substrate 102. In other words, the isolation structure 120 is formed at the boundary between a PDAF pixel unit 106 an image-capture pixel unit 108 and the boundary between neighboring two image-capture pixel units 108. In some embodiments, the isolation structure 120 may be or include silicon oxide, silicon nitride, silicon oxynitride, a combination thereof, or the like, and may be formed by a patterning process and deposition process.

The photoelectric conversion elements 122 and 123, such as photodiodes, are disposed in the substrates 102 in which the photoelectric conversion elements 122 are disposed in the image-capture pixel units 108, and the photoelectric conversion elements 123 are disposed in the PDAF pixel units 106. The photoelectric conversion elements 122 are separated from each other and from the photoelectric conversion elements 123 by the isolation structure 120. In some embodiments, a single photoelectric conversion element 122 is formed in a single image-capture pixel unit 108, and four photoelectric conversion elements 123 are formed in a single PDAF pixel unit 106. The photoelectric conversion elements 122 and 123 are configured to sense the incident light and generate an intensity signal according to the intensity of the incident light falling thereon.

In some embodiments, the photoelectric conversion elements 122 and 123 are disposed adjacent to the back surface of the substrate 102. The front surface of the substrate 102 usually has a wiring layer (not shown) of various wiring lines and electronic circuits required for the solid-state imaging device 100 formed thereon. In some embodiments shown in FIGS. 1A to 1B-3, the solid-state imaging device 100 is a backside illumination (BSI) imaging device. In the BSI imaging device, the back surface of the substrate 102 having the photoelectric conversion elements 122 and 123 formed thereon is close to the incident light receiving surface of the solid-state imaging device 100. The front surface of the substrate 102 having the wiring layer formed thereon is far from the incident light receiving surface of the solid-state imaging device 100.

In some other embodiments, the solid-state imaging device 100 is a front-side illumination (FSI) imaging device. In the FSI imaging device, the front surface of the substrate 102 having the wiring layer formed thereon is close to the incident light receiving surface of the solid-state imaging device. The back surface of the substrate 102 having the photoelectric conversion elements formed thereon is far from the incident light receiving surface of the solid-state imaging device.

The solid-state imaging device 100 also includes a high dielectric-constant (high-k) film 124 and a buffer layer 126. The high-k film 124 is disposed over the substrate 102 and covering the photoelectric conversion elements 122 and 123. The buffer layer 126 is disposed over the high-k film 124. In some embodiments, the high-k film 124 may be or include hafnium oxide ($HfO_2$), hafnium tantalum oxide (HfTaO), hafnium titanium oxide (HfTiO), hafnium zirconium oxide (HfZrO), tantalum pentoxide ($Ta_2O_5$), a combination thereof, or the like, and may be formed by a deposition process. The buffer layer 126 may be or include silicon oxide, silicon nitride, silicon oxynitride, and may be formed by a deposition process.

The metal grid structure 110 including the first portions 112, the second portions 114 and the third portions 115 is disposed over the buffer layer 126. The metal grid structure 110 is configured as optical isolation between adjacent pixel units to increase sensitivity (e.g., quantum efficiency (QE)) and reduce the crosstalk between pixel units. In some embodiments, the metal grid structure 110 may be or include tungsten (W), copper (Cu), or aluminum copper (AlCu), and may be formed by a deposition process or electroplating followed by a patterning process.

The solid-state imaging device 100 also includes a passivation layer 128 disposed over the upper surface of the buffer layer 126 and cover the metal grid structure 110. The passivation layer 128 is filled in the openings of the metal grid structure 110. The passivation layer 128 has a flat top surface. In some embodiments, the passivation layer 128 may be or include silicon oxide, silicon nitride, silicon oxynitride, a combination thereof, or the like, and may be formed by a deposition process. In some other embodiments, the passivation layer 128 is not formed. The thickness of the passivation layer 128 may be in a range from 0 μm (not formed) to about 0.3 μm, such as 0.05 to about 0.3 μm.

The solid-state imaging device 100 also includes a dielectric grid structure 130 and color filters 132 and 133 disposed over the upper surface of the passivation layer 128. The dielectric grid structure 130 defines openings filled by the color filters 132 and 133. The color filters 132 are correspondingly disposed over the image-capture pixel units 108, and the color filters 133 are correspondingly disposed over the PDAF pixel units 106. In some embodiments, the dielectric grid structure 130 is disposed above and aligned with the metal grid structure 110. When viewed from a top view, the dielectric grid structure 130 has a shape that is the same or similar to the shape of the metal grid structure 110.

A portion of the dielectric grid structure 130 disposed at a boundary between two neighboring image-capture pixel units 108 is defined as a first portion 142. Portions of the dielectric grid structure 130 disposed at boundaries between a PDAF pixel unit 106 and two image-capture pixel units 108 adjacent thereto are defined as a second portion 144 and a third portions 145. The second portion 144 is disposed at a side of a PDAF pixel unit 106 close to the pixel array center C, and the third portion 145 is disposed at the other side of the PDAF pixel unit 106 close to the pixel array edge E1 (or E2).

In some embodiments, the dielectric grid structure 130 may be a transparent material with a refractive index less than a refractive index of the color filters 132. Due to the low refractive index of the dielectric grid structure 130, the incident light within the color filters 132 and 133 undergoes total internal reflection, and thus the dielectric grid structure 130 serves as a light guide to direct the incident light to the photoelectric conversion elements 122 and 123 through the color filters 132 and 133. In some embodiments, the dielectric grid structure 130 may be or include a dielectric, such as silicon oxide (e.g., $SiO_2$) or hafnium oxide (e.g., $HfO_2$), and may be formed by a deposition process and a patterning process. The color filters 132 and 133 are assigned corresponding colors or wavelengths of the incident light, and configured to filter out all but the assigned colors or wavelengths of the incident light.

The solid-state imaging device 100 also includes a planarization layer 134 and a low-n oxide layer 136. The planarization layer 134 is disposed over the dielectric grid structure 130 and the color filters 132 and 133. In some embodiments, the refractive index of the planarization layer 134 is less than 1.6. The low-n oxide layer 136 is disposed over the planarization layer 134. In some embodiments, the low-n oxide layer 136 is an antireflective layer having the refractive index in a range from about 1.2 to about 1.5. In some embodiments, the low-n oxide layer 136 may be or include silicon oxide (e.g., $SiO_2$), and may be formed by a deposition process or coating process.

In the embodiments of the present disclosure, no microlens is formed over the solid-state imaging device 100. In other words, the solid-state imaging device 100 does not include microlens formed on the low-n oxide layer 136. Because the microlenses correspondingly disposed over the pixel units 106 and 108 focus the incident light on the focuses, the thickness of the color filters is limited. In the embodiments without the microlenses, the thickness of the color filter 132 can be increased when compared to a case of forming the microlenses over the solid-state imaging device 100. For example, the thickness of the color filters 132 and 133 in the FIGS. 1B-I to 1B-3 may be in a range from about 0.85 μm to about 1.3 μm. In the embodiments of the present disclosure, the thicker color filters 132 and 133 enhance the color purity of the incident light, resulting in enhancing the performance of the solid-state imaging device.

However, the incident light radiates onto the non-central area of a pixel array at an oblique angle that is greater than a normal angle of the incident light radiating onto the central area of the pixel array. The incident angle is an angle between the normal line of a light-receiving surface of the solid-state imaging devices and of the incident light. Thus, the crosstalk between the pixel units in the non-central area is higher than in the central area which reduces the sensitivity of the PDAF pixel units in the non-central area. The embodiments of the present disclosure utilize the metal grid structure 110, which includes a metal grid disposed at a side of a PDAF pixel unit 106 which is close to the pixel array center C. The metal grid has a width greater than a width of a metal grid disposed between two image-capture pixel units 108, which reduces the crosstalk between pixel units and increases the sensitivity of the PDAF pixel units. This is discussed in detail below.

Referring back to FIG. 1A, FIG. 1A shows that three sets of pixel units arranged in the first direction D1 are respectively located in the central area 109C, the intermediate area, and the edge area of the pixel array 109 to illustrate the width variation of the metal grid structure 110, each set of pixel units including one PDAF pixel unit 106 and numerous image-capture pixel units 108. The intermediate area and the edge area are located in the non-central area 109O of the pixel array 109, and the intermediate area is between the central area 109C and the edge area.

Figures 1, 1B:
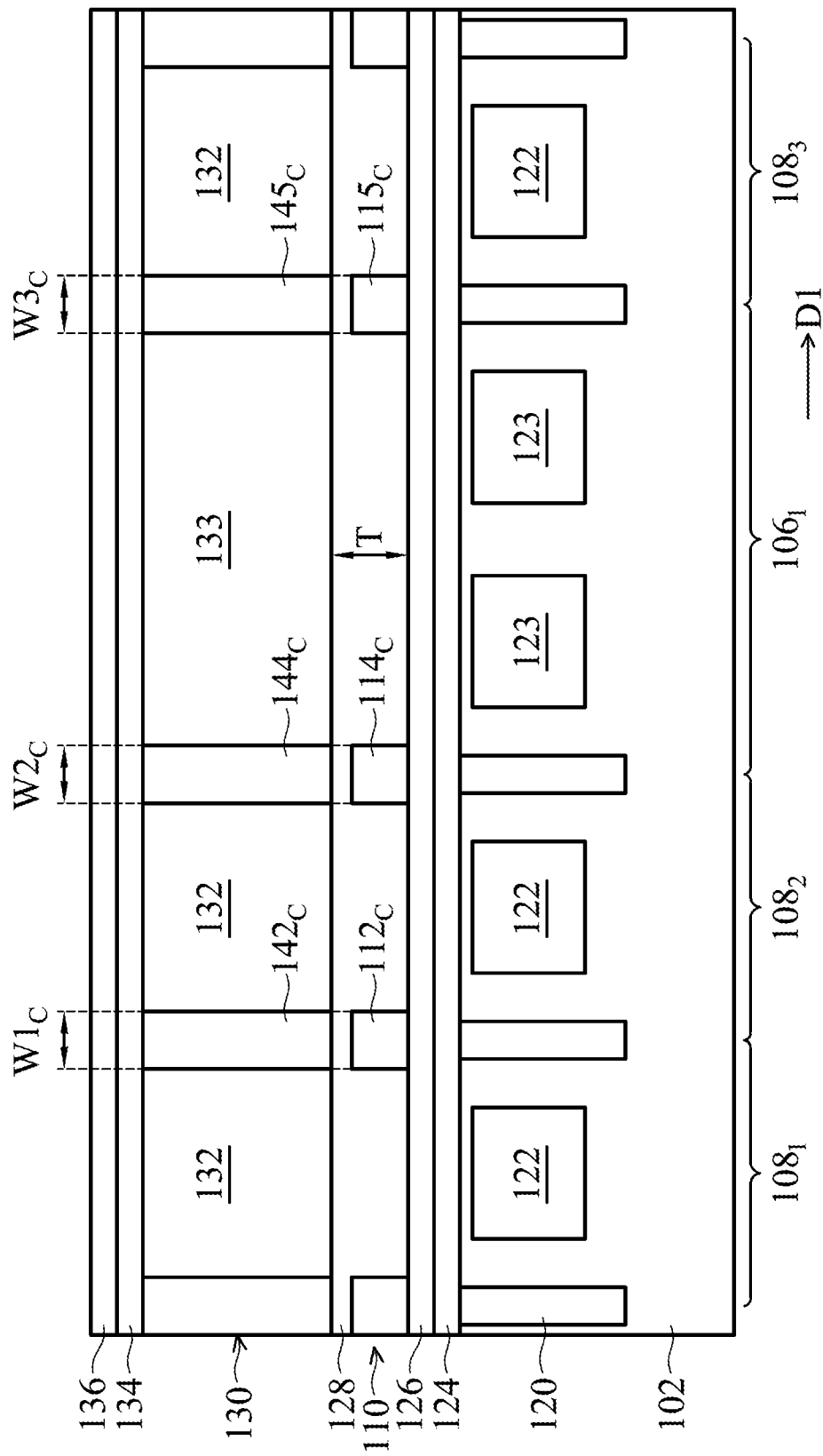
FIGS. 1B-1, 1B-2 and 1B-3 show cross-sectional views of portions of the solid-state imaging device shown in FIG. 1A in accordance with some embodiments of the present disclosure.
Figures 1, 1B, 2:
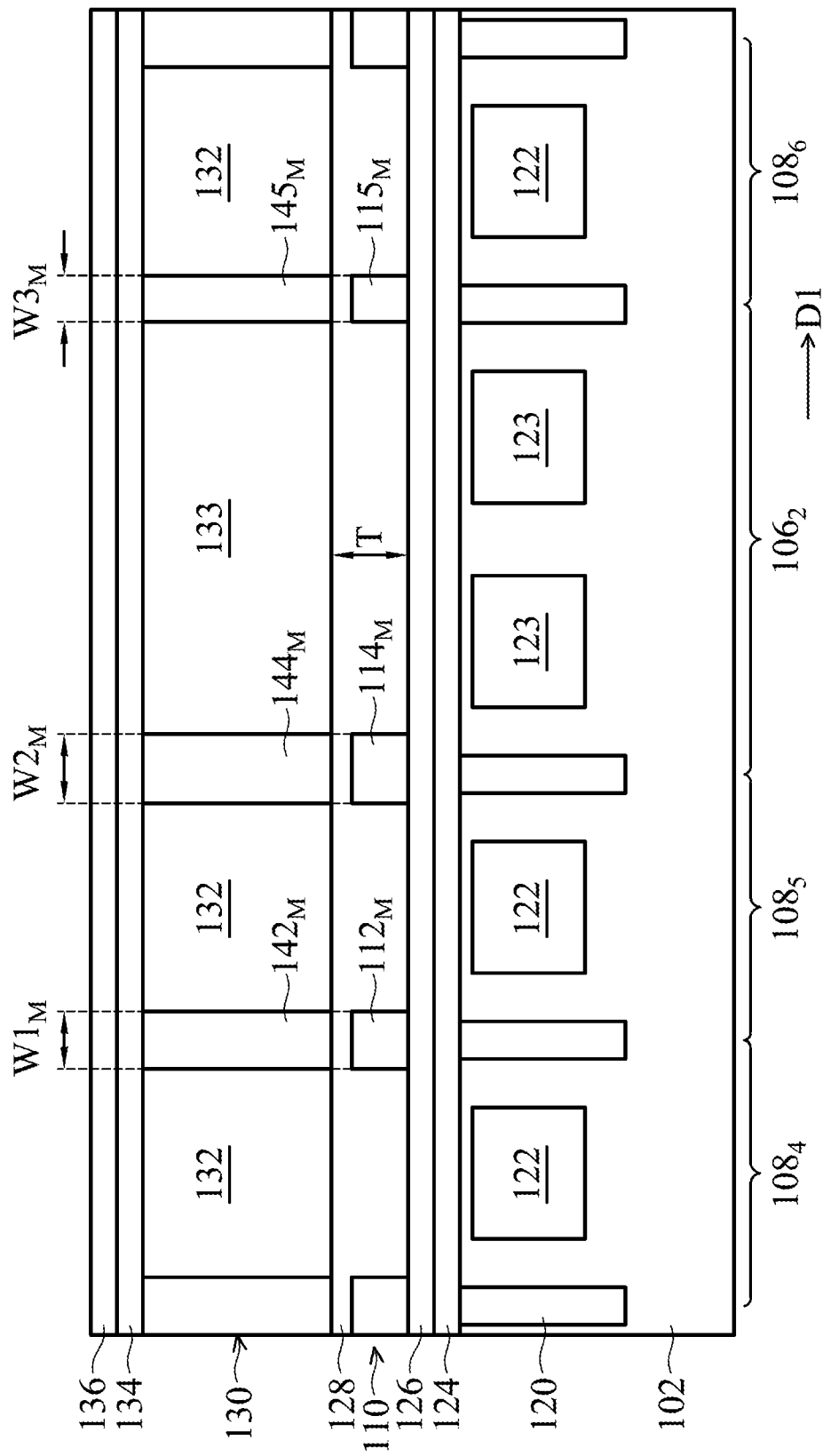
Figures 1, 1B, 2, 3:
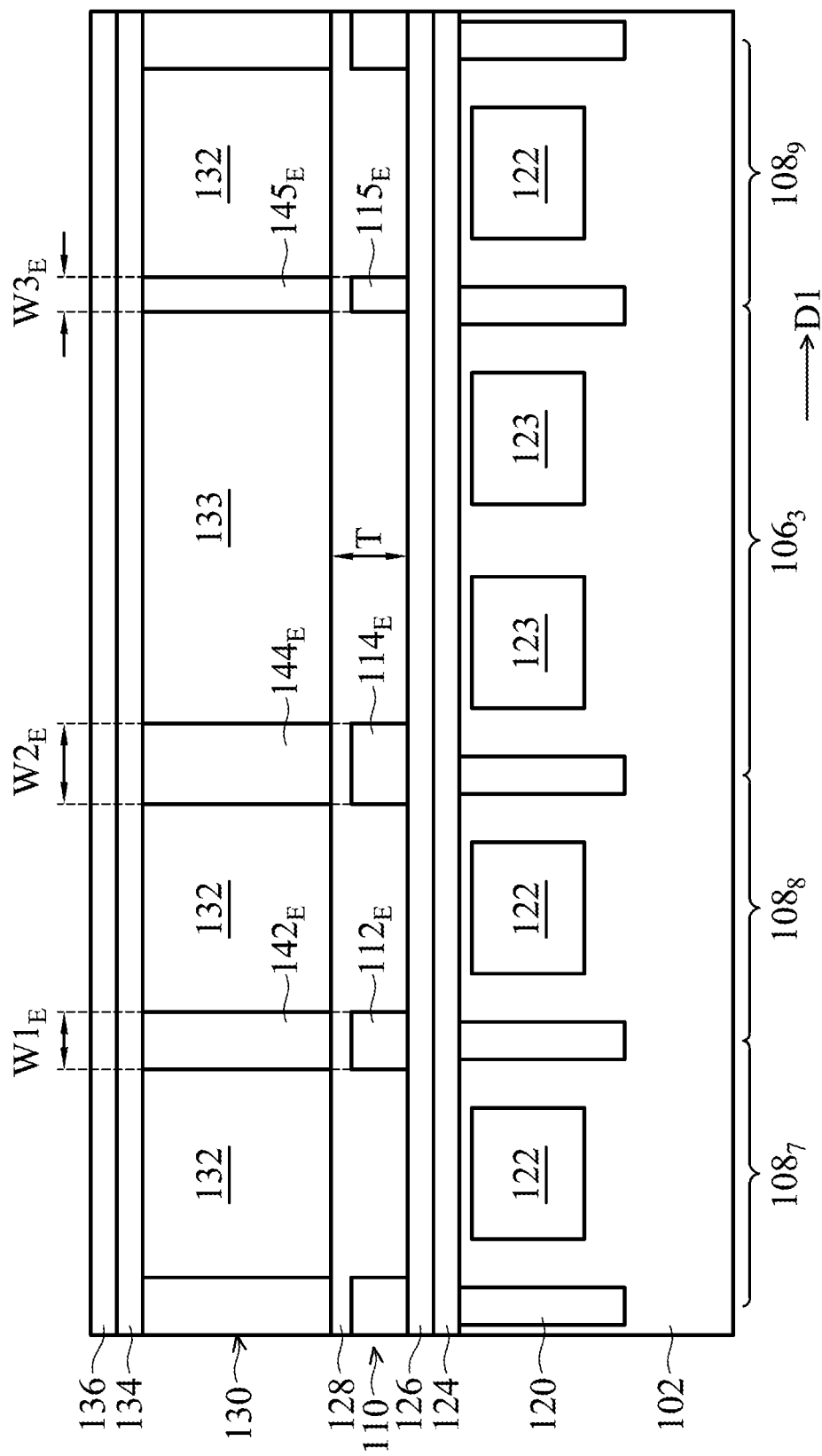
Figures 1, 1C:
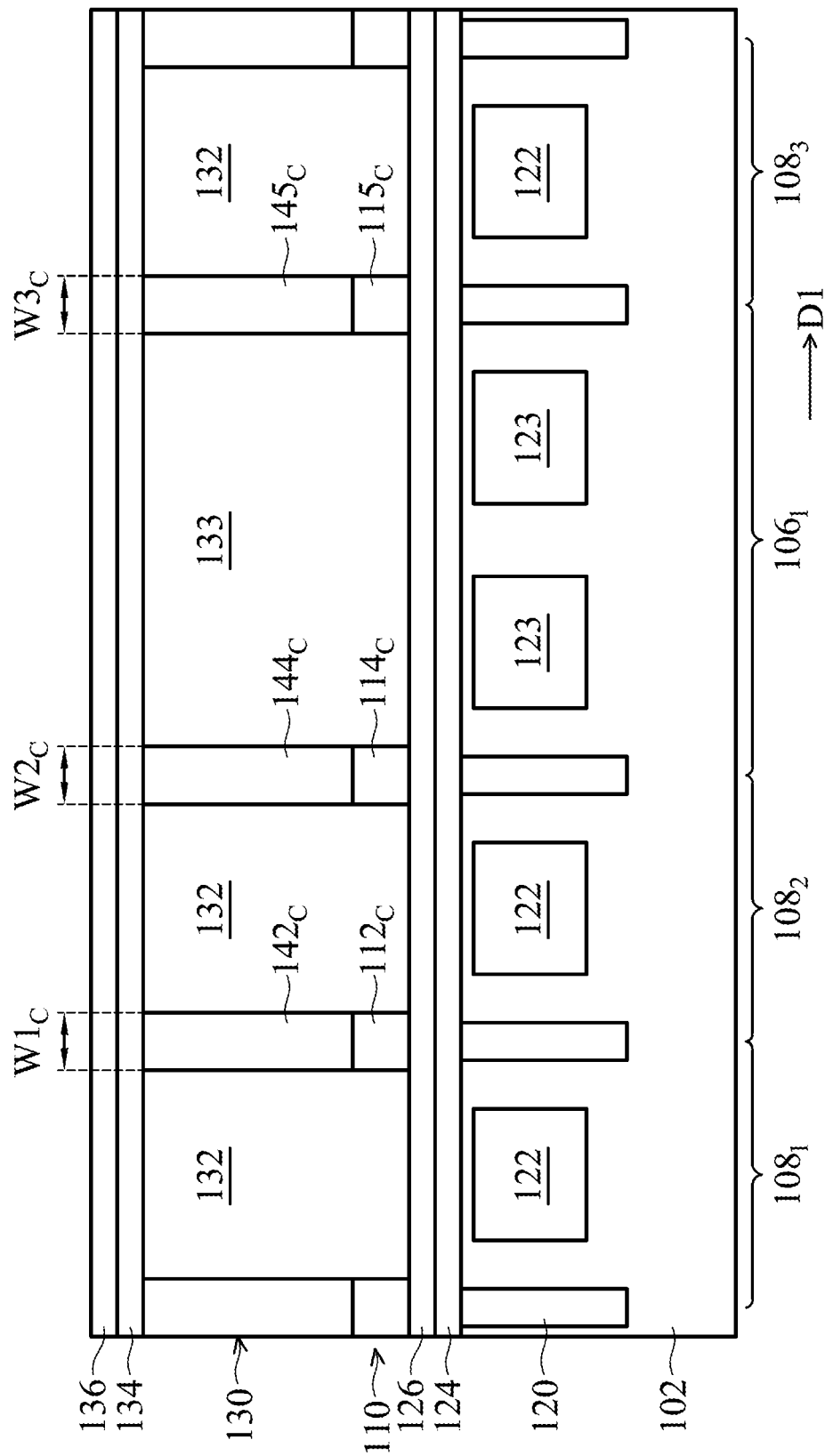
Figures 1, 1C, 2:
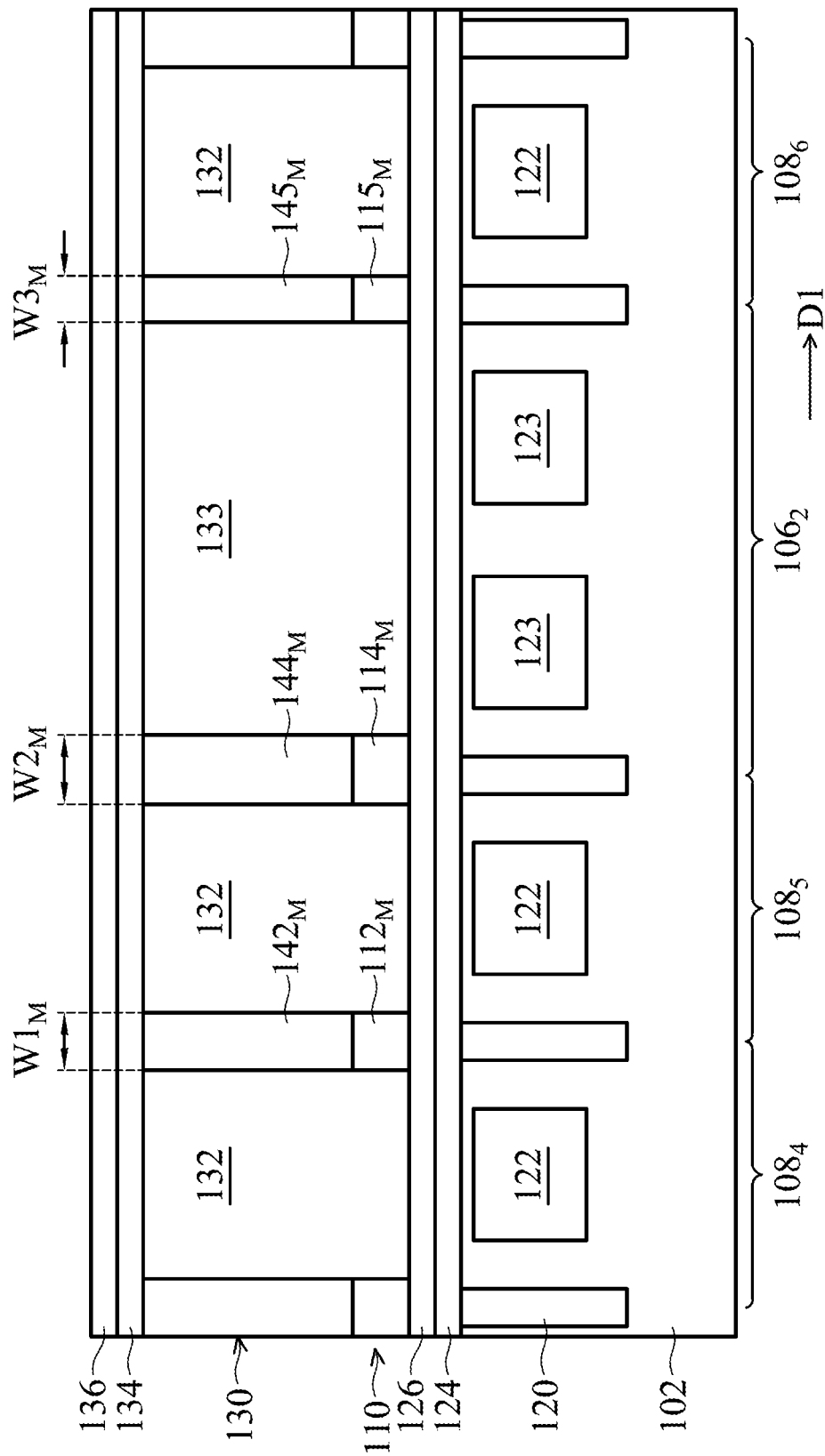
Figures 1, 1C, 2, 3:
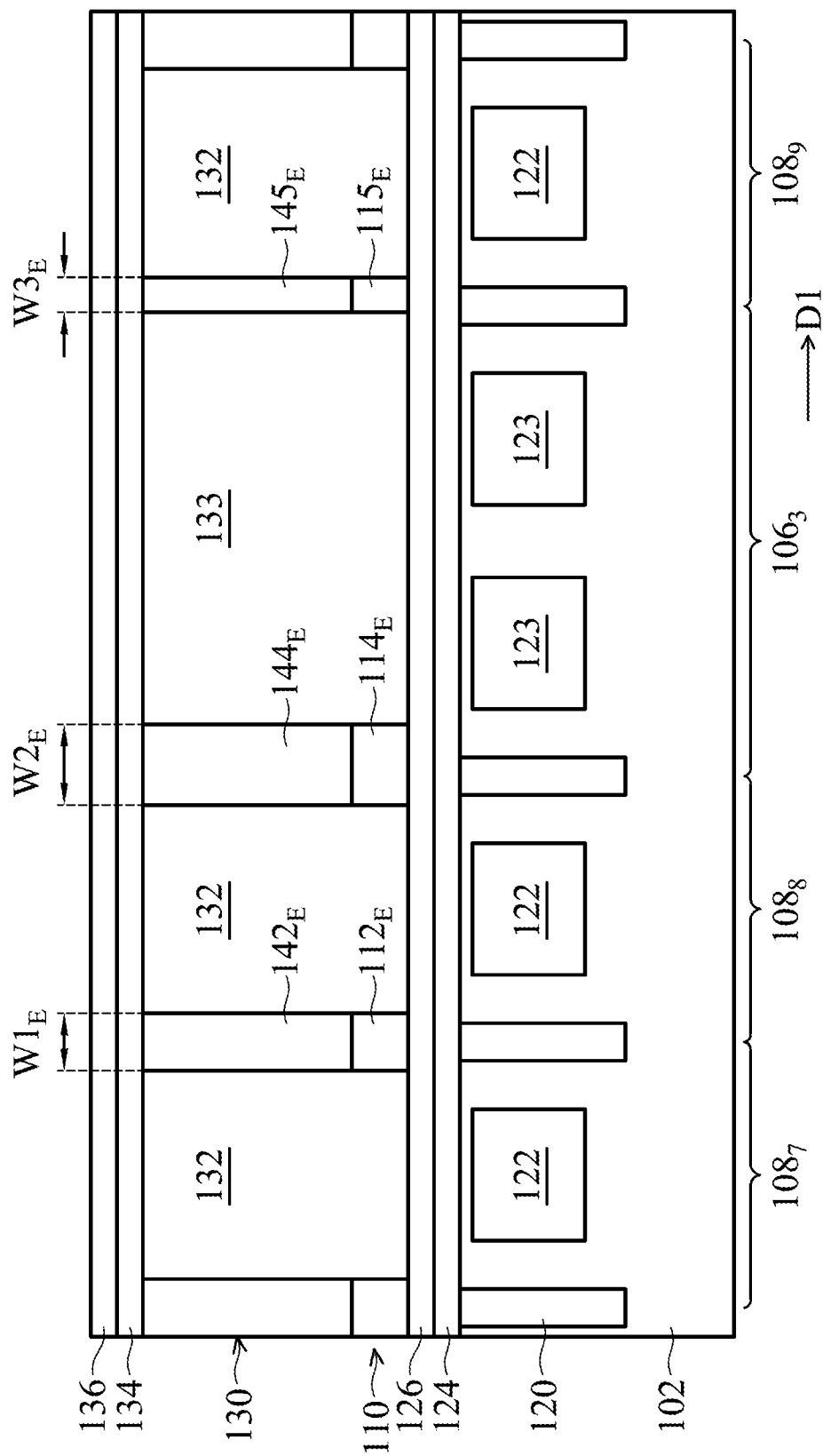

Referring to FIGS. 1A to 1B-3, when measured in the first direction D1, the first portions 112 have respective first widths W1 that are consistent from the center C toward the edge E1 of the pixel array 109. In some embodiments, the first width W1 may be in a range from about 0.06 um to about 0.2 um. For example, the first width $W1_E$ of the first portion $112_E$ in the edge area of the pixel array 109 is equal to the first width $W1_M$ of the first portion $112_M$ in the intermediate area of the pixel array 109 and the first width $W1_C$ of the first portion $112_C$ in the central area 109C of the pixel array 109.

When measured in the first direction D1, the second portions 114 have respective second widths W2 that increase from the center C toward the edge E1 of the pixel array 109. For example, the second width $W2_E$ of the second portion $114_E$ in the edge area of the pixel array 109 is greater than the second width $W2_M$ of the second portion $114_M$ in the intermediate area of the pixel array 109 that is greater than the second width $W2_C$ of the second portions $114_C"$ in the central area 109C of the pixel array 109.

When measured in the first direction D1, the third portions 115 have respective third widths W3 that decrease from the center C toward the edge E1 of the pixel array 109. For example, the third width $W3_E$ of the third portions $115_E$ in the edge area of the pixel array 109 is less than the third width $W3_M$ of the third portions $115_M$ in the intermediate area of the pixel array 109 that is less than the third width $W3_C$ of the third portions $115_C$ in the central area 109C of the pixel array 109. In some embodiments, the second and third widths W2 and W3 may be in a range from about 0.11 um to about 0.65 um.

Furthermore, in the central area 109C, the first width $W1_C$ of the first portion $112_C$ is equal to the second width $W2_C$ of the second portion $114_C$ and the third width $W3_C$ of the third portion $115_C$. Thus, the second widths W2 of the second portions 114 in the non-central area 109O are greater than the first widths W1 of the first portions 112 that are greater than the third widths W3 of the third portions 115 in the non-central area 109O.

Furthermore, in some embodiments, the second width $W2_M$ plus the third width $W3_M$ is equal to twice the first width $W1_M$. The second width $W2_E$ plus the third width $W3_E$ is equal to twice the first width $W1_E$.

Referring to FIG. 1B-I, in the central area 109C, half of the second portion $114_C$ is in the image-capture pixel unit 108 while the other half of the second portion $114_C$ is in the PDAF pixel unit 106. Referring to FIGS. 1B-2 and 1B-3, in the non-central area 109O, more than half of the second portion 114 is in the PDAF pixel unit 106 while less than half of the second portion 114 is in the image-capture pixel unit 108.

It should be noted that since the second portion 114 has increasing widths W2 in the PDAF pixel unit 106, the second portion 114 advantageously blocks the incident light from passing between neighboring pixel units, which reduces the crosstalk between pixel units and increases the sensitivity of the PDAF pixel units.

Still referring to FIG. 1A, when measured in the second direction D2, the first portions 112 have respective fourth widths W4 that are consistent from the center C toward the edge E2 of the pixel array 109. When measured in the second direction D2, the second portions 114 have respective fifth widths W5 that increase from the center C toward the edge E2 of the pixel array 109. When measured in the second direction D2, the third portions 115 have respective sixth widths W6 that decrease from the center C toward the edge E2 of the pixel array 109. Furthermore, the fourth width $W4_C$ of the first portion 112 is equal to the fifth width $W5_C$ of the second portion 114 and the sixth width $W6_C$ of the third portion 115.

According to the embodiments shown in FIGS. 1A to 1B-2, in the non-central area of the pixel array, the second portion of the metal grid structure disposed at the first side of the PDAF pixel unit close to the array center has a width that is greater than the width of the first portion of the metal grid structure disposed between two image-capture pixel units to provide a good balance between the color purity of the incident light and the crosstalk between the pixel array units.

FIGS. 1C-1 to 1C-3 are cross-sectional views illustrating portions of the solid-state imaging device 100 in the central area, the intermediate area and the edge area respectively, in accordance with some other embodiments of the present disclosure. Elements or layers in FIGS. 1C-1 to 1C-3 that are the same or similar are denoted by reference numerals like those in FIGS. 1B-1 to 1B-3 as they have the same meaning, and the description thereof will not be repeated for the sake of brevity. The difference between the embodiments shown in FIGS. 1C-1 to 1C-3 and FIGS. 1B-1 to 1C-3 is that in the embodiments shown in FIGS. 1C-1 to 1C-3, the passivation layer 128 as shown in FIGS. 1B-1 to 1C-3 is not formed.

Furthermore, the metal grid structure 110 contacts the dielectric grid structure 130. The metal grid structure 110 and the dielectric grid structure 130 collectively define the openings filled by the color filters 132 and 133. Thus, the thickness of the color filter 132 and 133 can be further increased. For example, the thickness of the color filters 132 and 133 in the FIGS. 1C-1 to 1C-3 may be in a range from about 0.85 μm to about 1.3 μm. Thus, the color purity of the incident light is enhanced, resulting in enhancing the performance of the solid-state imaging device.

Figure 2A:
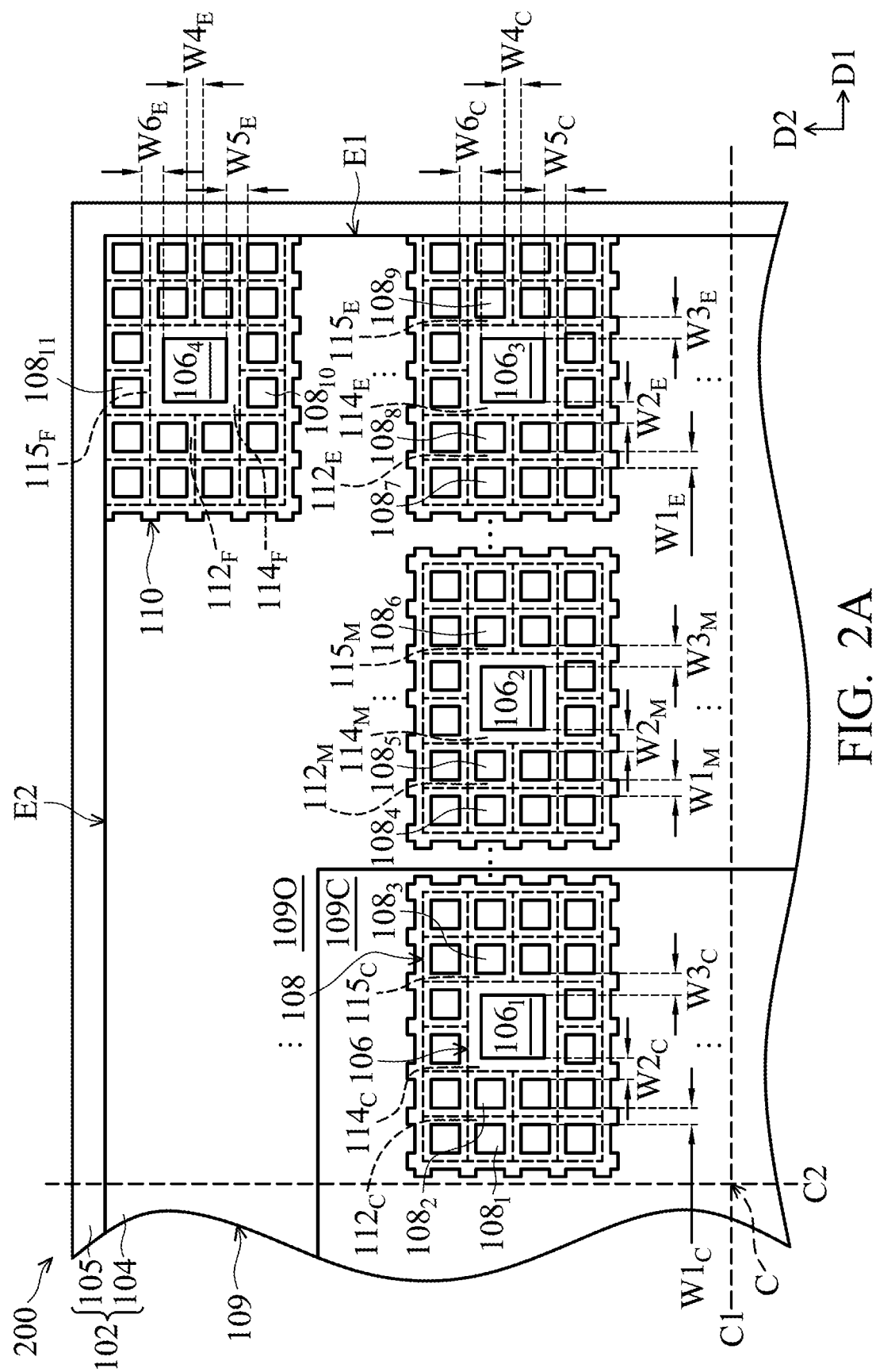
FIG. 2A shows a top view of a solid-state imaging device in accordance with some embodiments of the present disclosure.
Figure 2B:
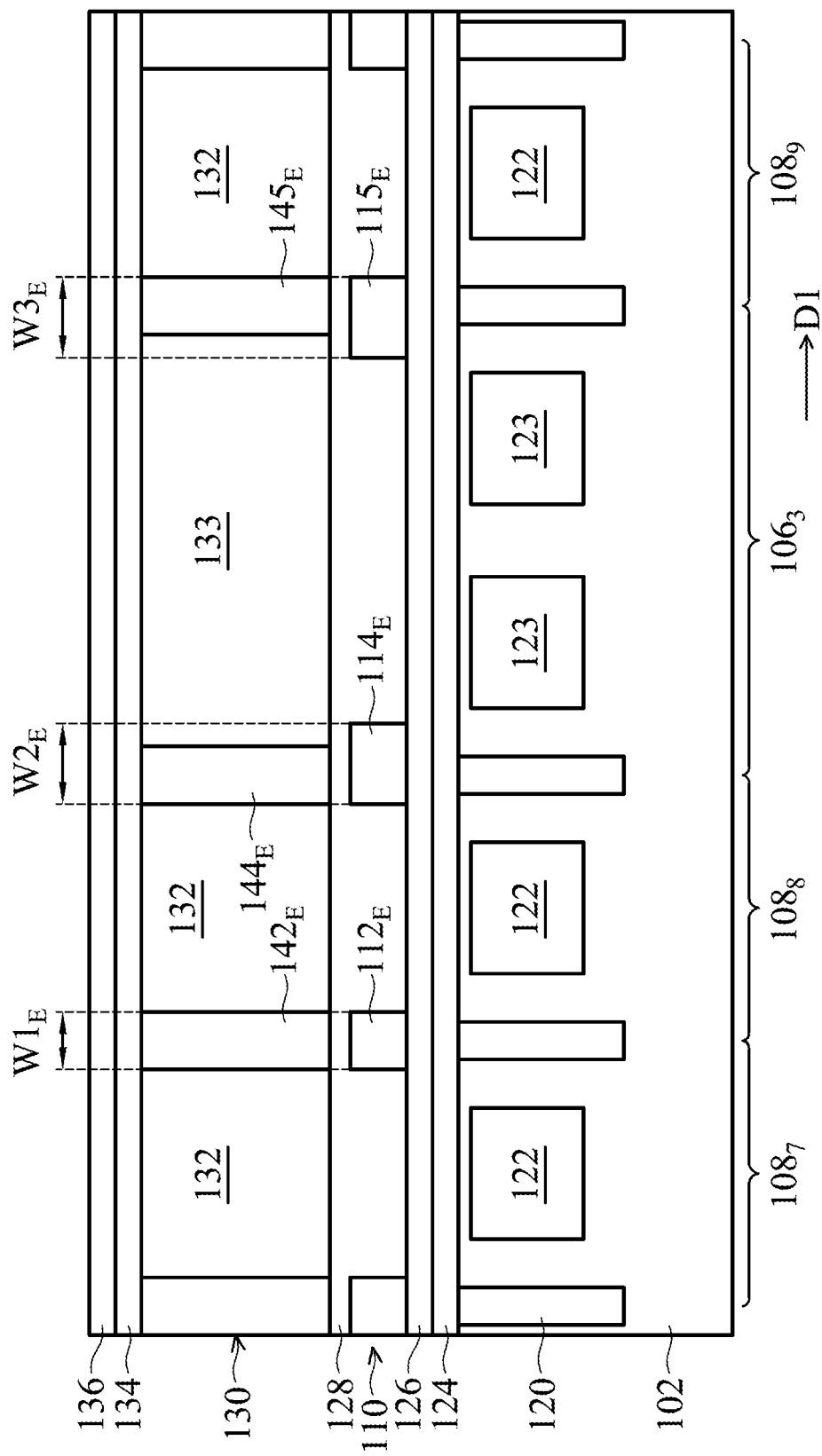
FIG. 2B shows a cross-sectional view of a portion of the solid-state imaging device shown in FIG. 2A in accordance with some embodiments of the present disclosure.
Figure 3:
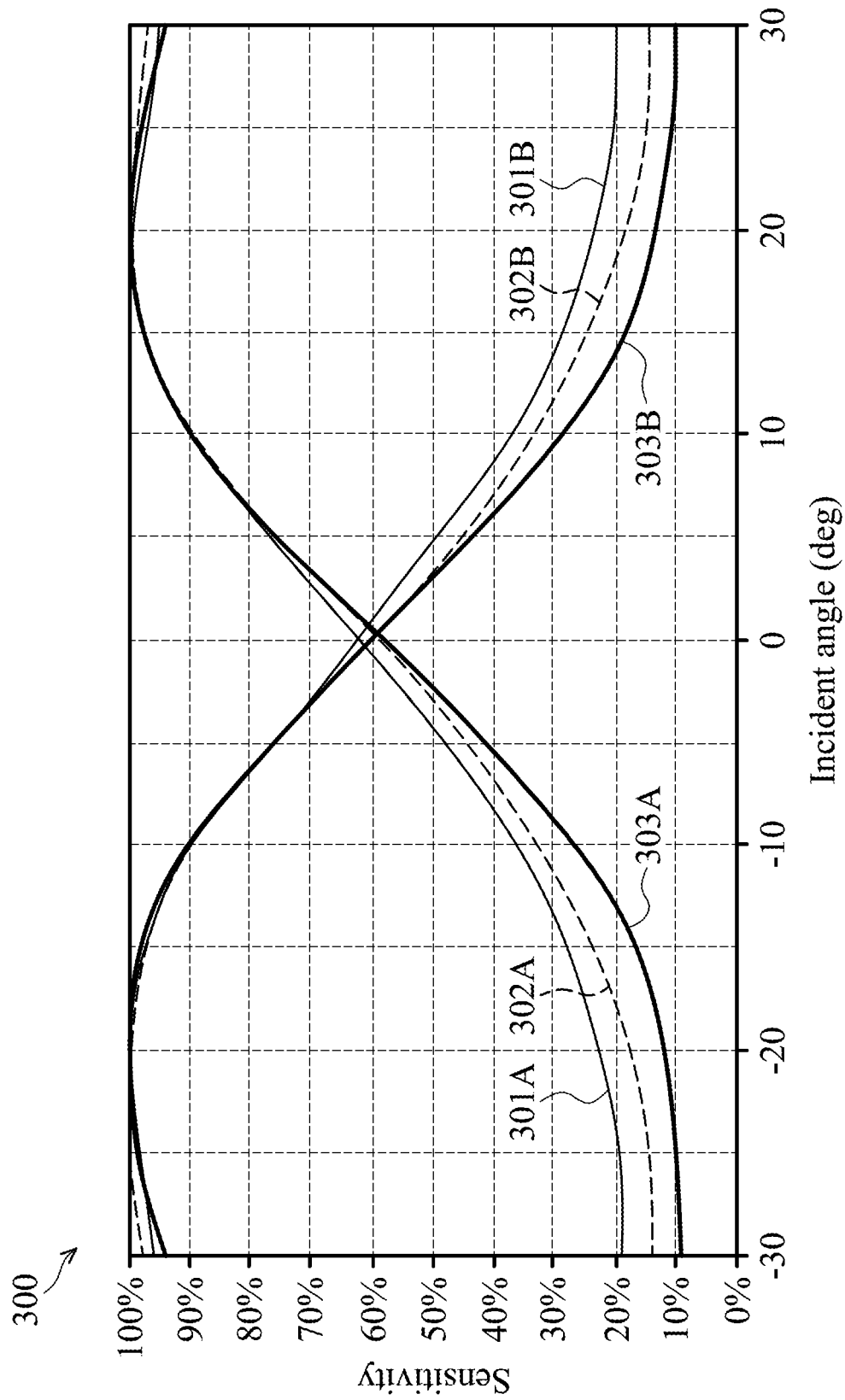

FIGS. 2A and 2B shows a top view and a cross-sectional view of a solid-state imaging device 200 in accordance with some other embodiments of the present disclosure. Elements or layers in FIGS. 2A and 2B that are the same or similar are denoted by reference numerals like those in FIGS. 1A to 1B-3 as they have the same meaning, and the description thereof will not be repeated for the sake of brevity.

FIG. 2A shows that three sets of pixel units arranged in the first direction D1 are respectively located in the central area 109C, the intermediate area, and the edge area of the pixel array 109 to illustrate the width variation of the metal grid structure 110, each set of pixel units including one PDAF pixel unit 106 and numerous image-capture pixel units 108. The intermediate area and the edge area are located in the non-central area 109O of the pixel array 109, and the intermediate area is between the central area 109C and the edge area. FIG. 2B is a cross-sectional view illustrating portions of the solid-state imaging device 100 in the edge area.

Referring to FIGS. 2A and 2B, when measured in the first direction D1, the first portions 112 have respective first widths W1 that are consistent from the center C toward the edge E1 of the pixel array 109. In some embodiments, the first width W1 may be in a range from about 0.06 um to about 0.2 um. For example, the first width $W1_E$ of the first portion $112_E$ in the edge area of the pixel array 109 is equal to the first width $W1_M$ of the first portion $112_M$ in the intermediate area of the pixel array 109 and the first width $W1_C$ of the first portion $112_C$ in the central area 109C of the pixel array 109.

When measured in the first direction D1, the second portions 114 have respective second widths W2 that are consistent from the center C toward the edge E1 of the pixel array 109. For example, the second width $W2_E$ of the second portion $114_E$ in the edge area of the pixel array 109 is equal to the second width $W2_M$ of the second portion $114_M$ in the intermediate area of the pixel array 109 and the second width $W2_C$ of the second portion $114_C$ in the central area 109C of the pixel array 109.

When measured in the first direction D1, the third portions 115 have respective third widths W3 that are consistent from the center C toward the edge E1 of the pixel array 109. For example, the third width $W3_E$ of the third portion $115_E$ in the edge area of the pixel array 109 is equal to the third width $W3_M$ of the third portion $115_M$ in the intermediate area of the pixel array 109 and the third width $W3_C$ of the third portion $115_C$ in the central area 109C of the pixel array 109. In some embodiments, the second and third widths W2 and W3 may be in a range from about 0.11 um to about 0.65 um.

Furthermore, both in the central area 109C or the non-central area 109O, the second widths W2 of the second portions 114 may be equal to the third widths W3 of the third portions 115 and are greater than the first widths W1 of the first portions 112.

Referring to FIG. 2B, more than half of the second portion $114_E$ is in the PDAF pixel unit $106_3$ while less than half of the second portion $114_E$ is in the image-capture pixel unit 108s.

It should be noted that since the second portions 114 has increasing widths W2 in the PDAF pixel unit 106, the second portions 114 advantageously block the incident light from passing between neighboring pixel units, which reduces the crosstalk between pixel units and increases the sensitivity of the PDAF pixel units.

Similarly, when measured in the second direction D2, the first portions 112 have respective fourth widths W4 that are consistent from the center C toward the edge E2 of the pixel array 109. When measured in the second direction D2, the second portions 114 have respective fifth widths W5 that are consistent from the center C toward the edge E2 of the pixel array 109. When measured in the second direction D2, the third portions 115 have respective sixth widths W6 that are consistent from the center C toward the edge E2 of the pixel array 109. In the embodiments shown in FIG. 2A, the fifth width W5 is equal to the sixth width W6 and greater than the fourth width W4.

According to the embodiments shown in FIGS. 2A and 2B, in the non-central area of the pixel array, the second portion of the metal grid structure disposed at the side of the PDAF pixel unit close to the array center has a width that is greater than the width of the first portion of the metal grid structure disposed between two image-capture pixel units to provide a good balance between the color purity of the incident light and the crosstalk between the pixel array units.

Furthermore, in some embodiments, the width of the dielectric grid structure 130 may be different than the width of the metal grid structure 110, as shown in FIG. 2B. For example, the second portion 144 of the dielectric grid structure 130 may be narrower than the second portion 114 of the metal grid structure 110. The third portion 145 of the dielectric grid structure 130 may be narrower than the third portion 115 of the metal grid structure 110.

In addition, the embodiments of the present disclosure also provide methods for modifying the sensitivity characteristics of the PDAF pixel units in which no microlens is formed.

Figure 4:
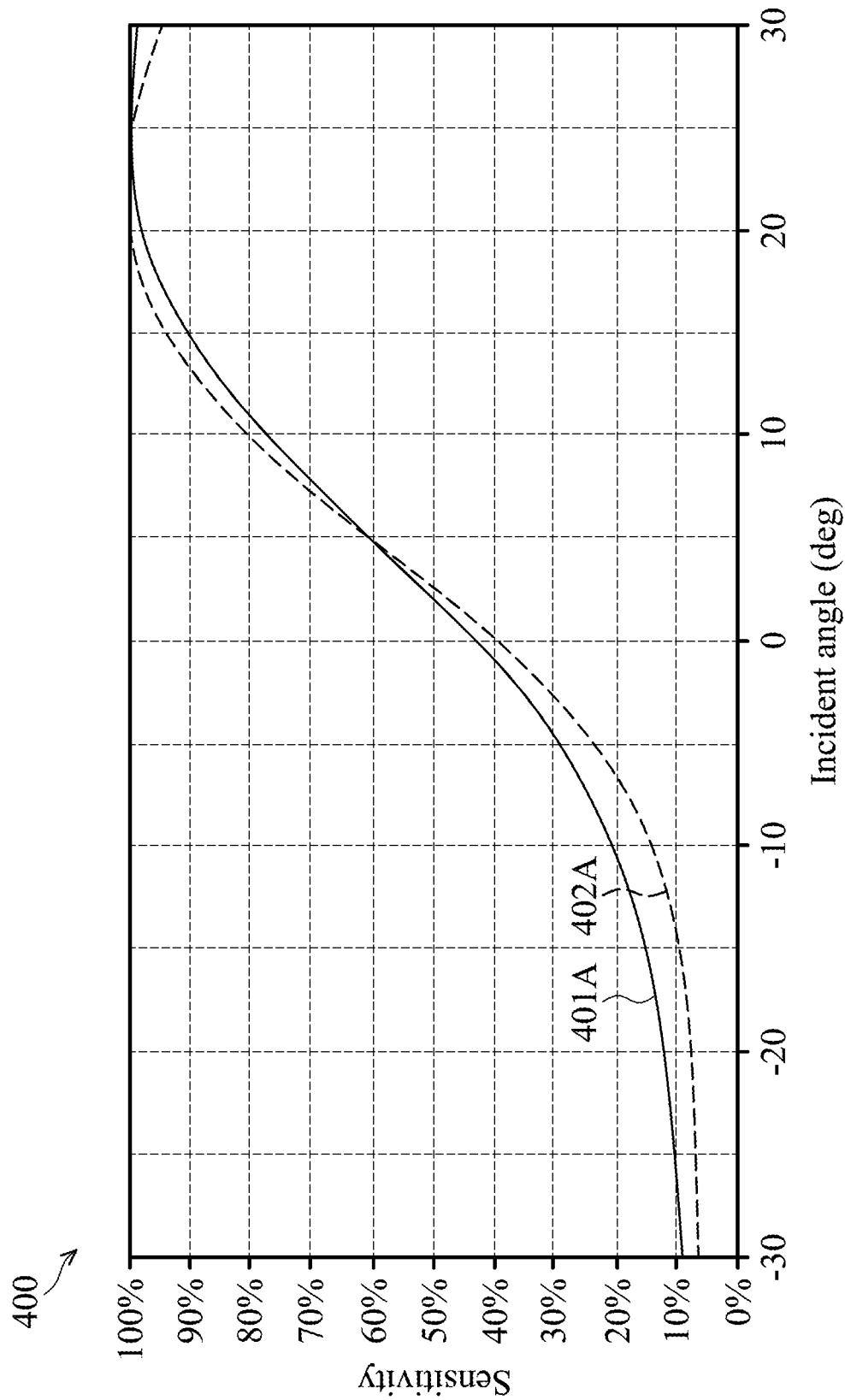
FIG. 4 is a graph of ARCs illustrating simulated results of the relationship between the sensitivity of a PDAF pixel unit in a central area of a pixel array and an incidence angle of an incident light on a PDAF pixel unit in accordance with some embodiments of the present disclosure.

FIGS. 3 and 4 are graphs 300 and 400 of angular response curves (ARCs) illustrating simulated results of the relationship between the sensitivity of a PDAF pixel unit 106 in the central area 109C of the pixel array 109 and the incidence angle of the incident light on the PDAF pixel unit 106 in accordance with some embodiments of the present disclosure. The curves ending with "A" (e.g. 301A) illustrate the sensitivity characteristics of the PDAF pixel unit 106 collecting by the photoelectric conversion elements 123 close to the right side while the curves ending with "B" (e.g. 301B) illustrate the sensitivity characteristics of the PDAF pixel unit 106 collecting by the photoelectric conversion elements 123 close to the left side.

Referring to FIG. 3, the curves 301A-303B illustrate the sensitivity characteristics of the PDAF pixel units 106 as shown in FIG. 2B, in which the curves 303A-B, 302A-B, and 301A-B represent that the second widths W2 of the second portion 114 are high, medium and low respectively.

The graph 300 demonstrates that the higher second width W2 of the second portion 114 results in the higher sensitivity slope. Thus, by modifying the widths of the second portions of the metal grid structure, the sensitivity characteristics of the PDAF pixel units 106 can be modified in the case of no microlens.

Referring to FIG. 4, the curves 401A and 402A illustrate the sensitivity characteristics of the PDAF pixel units 106 as shown in FIG. 1B-1, in which the curve 401A represents that the thickness T of the passivation layer 128 is 0 μm (i.e. not formed) and the curve 402A represents that the thickness T of the passivation layer 128 is 0.4 μm. The graph 400 demonstrates that the higher thickness T of the passivation layer 128 results in the higher sensitivity slope. Thus, by modifying the thickness of the passivation layer, the sensitivity characteristics of the PDAF pixel units 106 can be modified in the case of no microlens.

According to the embodiments of the present disclosure, the solid-state imaging device does not include microlens formed over the solid-state imaging device. Thus, the thickness of the color filter can be increased, which enhanced the color purity of the incident light, resulting in enhancing the performance of the solid-state imaging device.

Furthermore, in the non-central area of the pixel array, the second portion of the metal grid structure disposed at a side of the PDAF pixel unit which is close to the pixel array center has a width that is greater than a width of the first portion disposed of the metal grid structure between two image-capture pixel units. Thus, a good balance between the color purity of the incident light and the crosstalk between the pixel array units is provided.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
a first set of units disposed in a substrate, comprising a first pixel unit, a second pixel unit and a third pixel unit which are sequentially arranged and include respective photoelectric conversion elements;
a metal grid structure disposed over the first set of units, comprising:
a first portion disposed between the first pixel unit and the second pixel unit and having a first width; and
a second portion disposed between the second pixel unit and the third pixel unit and having a second width that is greater than the first width;
a dielectric grid structure disposed over the metal grid structure;
color filters disposed in the dielectric grid structure; and
a passivation layer disposed over and in the metal grid structure.

2. The solid-state imaging device as claimed in claim 1, wherein:
the first set of units further comprises a fourth pixel unit, wherein the third pixel unit is located between the second pixel unit and the fourth pixel unit;
the metal grid structure further comprises a third portion disposed between the third pixel unit and the fourth pixel unit and having a third width that is less than the first width.

3. The solid-state imaging device as claimed in claim 2, wherein the second width plus the third width is equal to twice the first width.

4. The solid-state imaging device as claimed in claim 1, wherein:
the first set of units further comprises a fourth pixel unit, wherein the third pixel unit is located between the second pixel unit and the fourth pixel unit;
the metal grid structure further comprises a third portion disposed between the third pixel unit and the fourth pixel unit and having a third width that is greater than the first width.

5. The solid-state imaging device as claimed in claim 1, wherein the first pixel unit and the second pixel unit are image-capture pixel units, and the third pixel unit is a phase detection autofocus (PDAF) pixel unit.

6. The solid-state imaging device as claimed in claim 1, further comprising:
a second set of units disposed in the substrate, comprising a fifth pixel unit, a sixth pixel unit and a seven pixel unit which are sequentially arranged and include respective photoelectric conversion elements,
wherein the metal grid structure further comprises:
a fourth portion disposed between the fifth pixel unit and the sixth pixel unit and having a fourth width; and
a fifth portion disposed between the sixth pixel unit and the seven pixel unit and having a fifth width that is equal to the fourth width.

7. The solid-state imaging device as claimed in claim 6, further comprising:
a third set of units disposed in the substrate, comprising an eighth pixel unit, a ninth pixel unit and a tenth pixel unit which are sequentially arranged and include respective photoelectric conversion elements,
wherein the metal grid structure further comprises:
a sixth portion disposed between the eighth pixel unit and the ninth pixel unit and having a sixth width; and
a seventh portion disposed between the ninth pixel unit and the tenth pixel unit and having a seventh width that is greater than the sixth width.

8. The solid-state imaging device as claimed in claim 7, wherein the first pixel unit, the second pixel unit, the fifth pixel unit, the sixth pixel unit, the eighth pixel unit, and the ninth pixel unit are image-capture pixel units, and the third pixel unit, the seven pixel unit, and the tenth pixel unit are phase detection autofocus (PDAF) pixel units.

9. The solid-state imaging device as claimed in claim 7, wherein the first set of units, the second set of units and the third set of units are arrayed into an array, and the second set of units, the first set of units, and third set of units are sequentially arranged in a direction from a center of the array toward an edge of the array.

10. The solid-state imaging device as claimed in claim 9, wherein the first pixel unit, the second pixel unit, and the third pixel unit are sequentially arranged in the direction from the center of the array toward the edge of the array.

11. The solid-state imaging device as claimed in claim 7, wherein the seventh width is greater than the second width, and the second width is greater than the fifth width.

12. The solid-state imaging device as claimed in claim 7, wherein:
the second set of units further comprises an eleventh pixel unit, wherein the seventh pixel unit is located between the sixth pixel unit and the eleventh pixel unit,
the third set of units further comprises a twelfth pixel unit, wherein the tenth pixel unit is located between the ninth pixel unit and the twelfth pixel unit,
wherein the metal grid structure further comprises:
an eighth portion disposed between the seventh pixel unit and the eleventh pixel unit and having an eighth width;
a ninth portion disposed between the tenth pixel unit and the twelfth pixel unit and having a ninth width that is less than the eighth width.

13. The solid-state imaging device as claimed in claim 1, further comprising:
an isolation structure disposed in the substrate, wherein the first set of units is defined by the isolation structure.

14. The solid-state imaging device as claimed in claim 1, further comprising:
a high-k film disposed over the substrate; and
a buffer layer disposed between the high-k film and the metal grid structure.

15. The solid-state imaging device as claimed in claim 1, wherein a thickness of the passivation layer ranges from 0.05 μm to 0.3 μm.

16. The solid-state imaging device as claimed in claim 1, wherein the color filters are further disposed in the metal grid structure.

17. The solid-state imaging device as claimed in claim 1, further comprising:
a planarization layer disposed over the dielectric grid structure and the color filters; and
a low index-of-refraction (low-n) oxide layer disposed over the planarization layer.

18. The solid-state imaging device as claimed in claim 17, wherein there is no microlens over the low-n oxide layer.

\* \* \* \* \*